United States Patent
Harris et al.

(10) Patent No.: US 7,332,924 B2
(45) Date of Patent: Feb. 19, 2008

(54) EMBEDDED TEST CIRCUITRY AND A METHOD FOR TESTING A SEMICONDUCTOR DEVICE FOR BREAKDOWN, WEAROUT OR FAILURE

(75) Inventors: Edward B. Harris, Fogelsville, PA (US); Bonnie E. Weir, Bronxville, NY (US)

(73) Assignee: Agere Systems, Inc., Allentown, PA (US)

( * ) Notice: Subject to any disclaimer, the term of this patent is extended or adjusted under 35 U.S.C. 154(b) by 53 days.

(21) Appl. No.: 11/273,857

(22) Filed: Nov. 15, 2005

(65) Prior Publication Data

US 2007/0109005 A1 May 17, 2007

(51) Int. Cl.
G01R 31/26 (2006.01)
(52) U.S. Cl. ............. 324/765; 324/763; 324/768
(58) Field of Classification Search ............ 324/765, 324/766
See application file for complete search history.

(56) References Cited

U.S. PATENT DOCUMENTS

| | | | |
|---|---|---|---|
| 4,896,108 A | 1/1990 | Lynch et al. | |
| 6,114,843 A * | 9/2000 | Olah | 323/280 |
| 2001/0050567 A1* | 12/2001 | Bachelder et al. | 324/754 |
| 2003/0219913 A1* | 11/2003 | Pourkeramati et al. | 438/12 |
| 2004/0178787 A1* | 9/2004 | Liu | 324/158.1 |
| 2005/0090922 A1* | 4/2005 | Kinoshita et al. | 700/108 |

OTHER PUBLICATIONS

Unknown Author; "Ceramic High Performance Probe Cards"; website; at least as early as Oct. 24, 2005; www.celadonsystems.com.
Unknown Author; "MIRA-Modular Integrated Reliability Analyzer"; website; at least as early as Oct. 24, 2005; www.qualitau.com.
Unknown Author; "Model 1164—Reliability Test System"; website; at least as early as Oct. 24, 2005; www.aetrium.com/model_1164.html.

* cited by examiner

Primary Examiner—Minh N. Tang
(74) Attorney, Agent, or Firm—Daniel J. Santos

(57) ABSTRACT

Reliability testing circuitry is built into the wafer or IC package in the form of one or more individual testers that use small-area transistors as DUTs. Stress can be applied to the DUTs in parallel and information about breakdown, wearout or failure can be obtained from the individual testers. Only a few pads are needed to test hundreds and even thousands of the DUTs of the individual testers. Testing of many DUTs may be performed using a simple power supply and a few probes.

17 Claims, 5 Drawing Sheets

EMBEDDED TEST CIRCUITRY AND A METHOD FOR TESTING A SEMICONDUCTOR DEVICE FOR BREAKDOWN, WEAROUT OR FAILURE

TECHNICAL FIELD OF THE INVENTION

The invention relates to testing semiconductor materials for breakdown, wearout or failure. More particularly, the invention relates to providing test circuitry on an integrated circuit (IC) that enables multiple device under tests (DUTs) to be tested simultaneously for breakdown, wearout or failure.

BACKGROUND OF THE INVENTION

In semiconductors that use an oxide as an insulating layer, a high electric field in the oxide can result in a change in the physical properties of the gate oxide of a metal oxide semiconductor (MOS) such that the gate oxide no longer displays its insulating property. This result is generally referred to in the semiconductor industry as "breakdown". The phrase "hard breakdown" normally refers to a catastrophic, irreversible breakdown of the gate oxide involving thermal effects. The phrase "soft breakdown" normally refers to a breakdown in the MOS structure that results in a leakage current that exceeds a predetermined threshold value. Soft breakdown is also permanent and irreversible, but after soft breakdown, the oxide retains its insulating properties, and conduction through the breakdown spot is not ohmic.

The unreliability of oxides due to breakdown is one of the primary impediments to moving forward along the path predicted by Moore's law. As such, an efficient breakdown testing method is paramount to the success of a semiconductor manufacturer. Because soft breakdown is the prevailing breakdown mode for 90-130 nanometer (nm) technologies, oxide reliability testing now requires small-area test structures and statistically relevant data. Currently, one known testing technique is performed as follows. Small MOS field effect transistors (MOSFETs) are connected to large bond pads. The source and drain of the transistor are tied together to form one terminal, which is connected to ground. A constant voltage is then applied to the gate and the current flowing from between the gate terminal and the ground terminal is measured. If the current exceeds a particular threshold value, soft breakdown is occurring.

One of the disadvantages of this technique is that the transistor area is only about 1 micrometer ($\mu m^2$) in area while the area required for each of the pads is about 40,000 $\mu m^2$. Normally, many sites are tested on each wafer. Therefore, a significant amount of area on the wafer is consumed for soft breakdown testing, which results in wasted area that could otherwise be used for transistors. In addition, with this known technique, the transistors are tested serially, which requires the placement of the probes on the pads of each test site to apply the constant voltage and measure the current. Alternatively, equipment may be used to contact many probe pads simultaneously, and to interface the probes to power supplies and measurement electronics. However, such equipment is very expensive.

A need exists for an efficient, easy and cost-effective way to simultaneously test multiple sites for breakdown, wearout or reliability that does not require expensive test equipment.

SUMMARY OF THE INVENTION

The present invention provides embedded test circuitry for testing a semiconductor device for breakdown, wearout or failure and a corresponding method. The test circuitry is embedded in the semiconductor device and comprises at least two testers, each of which comprises a DUT embedded in the semiconductor device, a voltage supply connection for enabling a power supply that is external to the semiconductor device to be connected to the tester for supplying voltage to the DUT, and a current monitoring connection for enabling a current monitoring device to be electrically coupled to the current monitoring connection for monitoring a current passing through the DUT. The supply voltage connections of the testers are electrically coupled such that the supply voltages are simultaneously supplied to the supply voltage connections of the testers.

The method of the present invention for testing a semiconductor device for breakdown, wearout or failure comprises embedding testing circuitry in the semiconductor device comprising at least two testers, electrically coupling the external power supply to the voltage supply connection such that the supply voltages are simultaneously supplied to the supply voltage connections of the testers, and electrically coupling a current monitoring device to the current monitoring connection for monitoring the current of the DUT.

These and other features and advantages of the invention will become apparent from the following description, drawings and claims.

DETAILED DESCRIPTION OF THE PREFERRED EMBODIMENTS

In accordance with the invention, reliability testing circuitry is built into the wafer or IC package in the form of one or more individual testers that preferably use small-area transistors as the DUTs. The DUTs may be other types of devices, such as, for example, capacitors. Stress can be applied to the DUTs in parallel and information about breakdown, failure or wearout can be obtained from the individual testers. In accordance with an exemplary embodiment of the invention, only a few pads are needed to test hundreds and even thousands of the small-area transistors of the individual testers, although DUTs other than transistors may be used to test for breakdown, failure or wearout. Testing may be performed using a simple power supply and a few probes.

Figure 1:
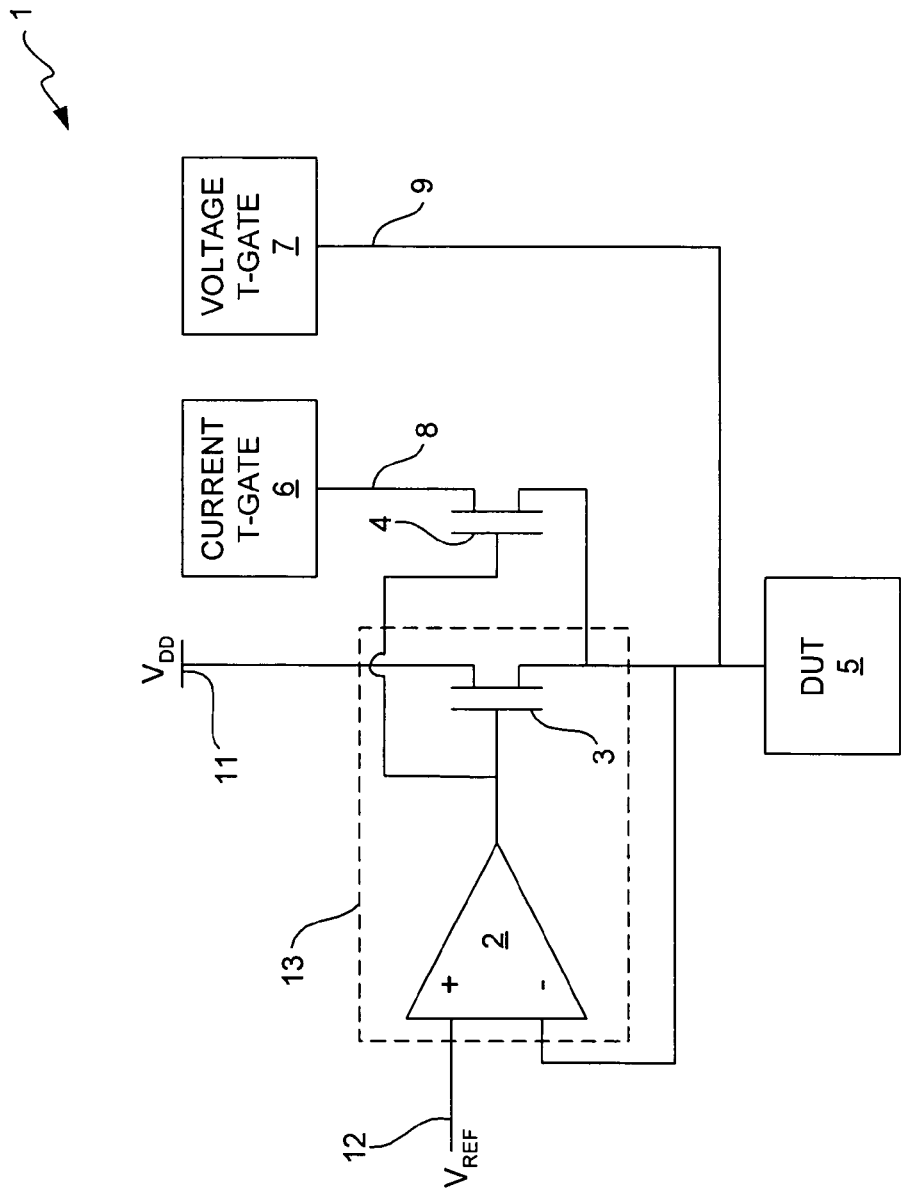
FIG. 1 illustrates a schematic diagram of an individual tester in accordance with an exemplary embodiment of the invention, which is built into a wafer or IC package.

FIG. 1 illustrates a schematic diagram of an individual tester 1 in accordance with an exemplary embodiment that is built into the wafer (not shown) or IC package (not shown). The tester 1 includes an operational amplifier (op-amp) 2, a first pass MOSFET 3, a second pass MOSFET 4, the DUT 5, a current transmission gate (T-gate) 6 and a voltage transmission gate (T-gate) 7. The combination of the op-amp 2 and pass MOSFET 3 form an independent voltage regulator 13 for each tester that provides the constant voltage needed for testing the DUT 5 for breakdown. In accordance with this exemplary embodiment, the DUT 5 is a small-area MOSFET. The second pass MOSFET 4 is set up as a current mirror to monitor the current in the DUT 5. The T-gates 6 and 7 connect the current monitoring and voltage monitoring connections 8 and 9 of the DUT 5 to a global bus (not shown) to enable the DUT current and voltage to be measured using relatively simple, inexpensive test equipment (e.g., an amp meter and a volt meter).

A global external power supply (not shown) connects to a supply voltage connection 11 for providing the supply voltage, $V_{DD}$, for all of the DUTs 5 to be tested. The external power supply also provides the power for the op-amp 2, although the connection is not shown for ease of illustration. The reference voltage, $V_{REF}$, preferably is also global, although it is not required to be global. The global reference voltage supply (not shown) electrically couples to reference voltage connection 12 for providing the reference voltage for all of the op-amps 2. The voltage regulator 13 is an optional component of the tester 1, but is preferred. Providing each DUT 5 with its own voltage regulator 13 eliminates the potential for any problems associated with short-circuited devices and/or IR (current×resistance) drop. For example, in cases where each tester is not provided with its own voltage regulator, failure of one DUT may result in failure of the other DUTS. Because each tester of the invention is provided with its own voltage regulator, the failure of one DUT of one tester will not present problems for the other testers. Using the voltage regulator 13, ensures that a constant voltage equal to $V_{REF}$ will always be applied to the gate of transistor 3, and thus to the DUT 5. $V_{REF}$ could be provided on-chip rather than being globally provided, but providing it globally provides the aforementioned advantages.

Figure 2:
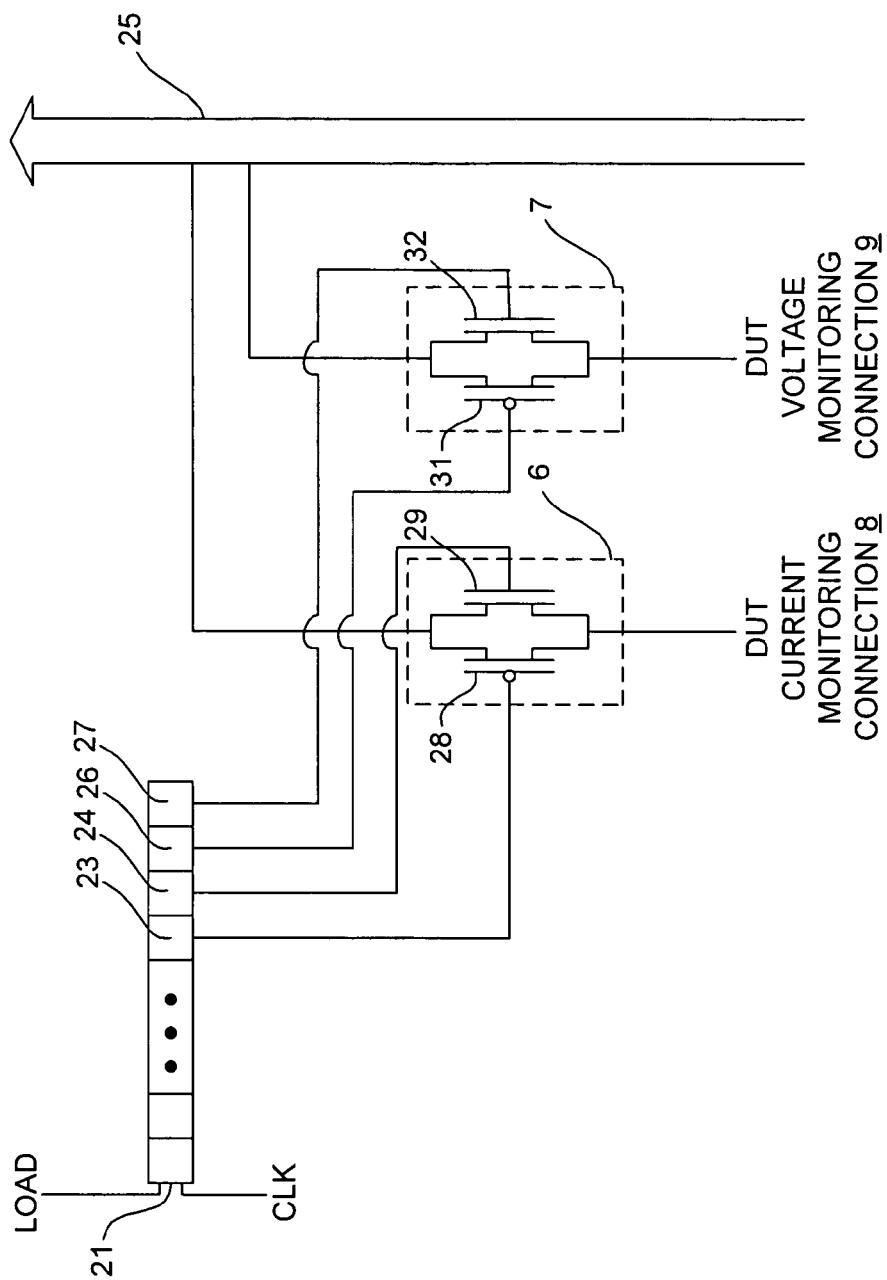
FIG. 2 illustrates a schematic diagram of the T-gates shown in FIG. 1 being activated by the contents of a shift register, which causes the T-gates to transmit to a bus.

FIG. 2 is a schematic diagram that illustrates the shift register 21 that is used to address the testers, the current monitoring T-gate 6 that transmits the DUT current upon being activated, the voltage monitoring T-gate 7 that transmits the DUT voltage upon being activated, and the bus 25 to which the T-gates 6 and 7 are electrically coupled. The phrase "electrically coupled" is used herein to denote both a direct electrical connection and an indirect electrical connection. For example, an example of a direct electrical connection would be connecting the external global power supply directly to connection 11 of the tester 1. An example of an indirect electrical connection would be connecting the external global power supply to a power supply network, which is, in turn, connected to each of the connections 11 of each of the testers. The phrase "electrically coupled" is intended to describe both types of connections. Preferably, the external global power supply will be connected to a power supply network that will be connected to each of the connections 11 of each of the testers 1.

In accordance with an exemplary embodiment, access to each of the DUTs 5 is accomplished using the shift register 21, which generates addresses that cause the T-gates 6 and 7 to transmit the DUT current and voltage, respectively, to the bus 25. This shift register 21 allows the tester size and pin count to be very small, even when testing a large number of DUTs. In order to read the current of any DUT, the location of the corresponding DUT is loaded into the shift register 21. For example, in order to cause T-gate 6 to transmit the DUT current, the value loaded into shift register 21 will be shifted until the location 23 in the register 21 is a logic bit 0 and the location 24 in register 21 is a logic bit 1. These values will cause the PFET 28 and the NFET 29 to be activated, which will allow the DUT current to be gated onto bus 25. In order to cause T-gate 7 to transmit the DUT voltage, the value loaded into shift register 21 will be shifted until the location 26 in the register 21 is a logic bit 0 and the location 27 in register 21 is a logic bit 1. These values will cause the PFET 31 and the NFET 32 to be activated, which will allow the DUT voltage to be gated onto bus 25. Typically, a logical value of 01 will be loaded into the shift register 21 and shifted through the register on every rising edge of the clock signal, CLK, when the register 21 is enabled. As the bits 01 are applied to the corresponding PFET and NFET, respectively, of each T-gate, the corresponding T-gate will transmit.

It should be noted that it is sufficient for each tester to have only either a current monitoring connection 8 or a voltage monitoring connection 9. Both are not needed. Preferably, each tester has at least a current monitoring connection 8. Also, although T-gates 6 and 7 are shown in FIGS. 1 and 2 as providing the current and voltage monitoring connections, a variety of different types of connections may be used for this purpose.

Figure 3:
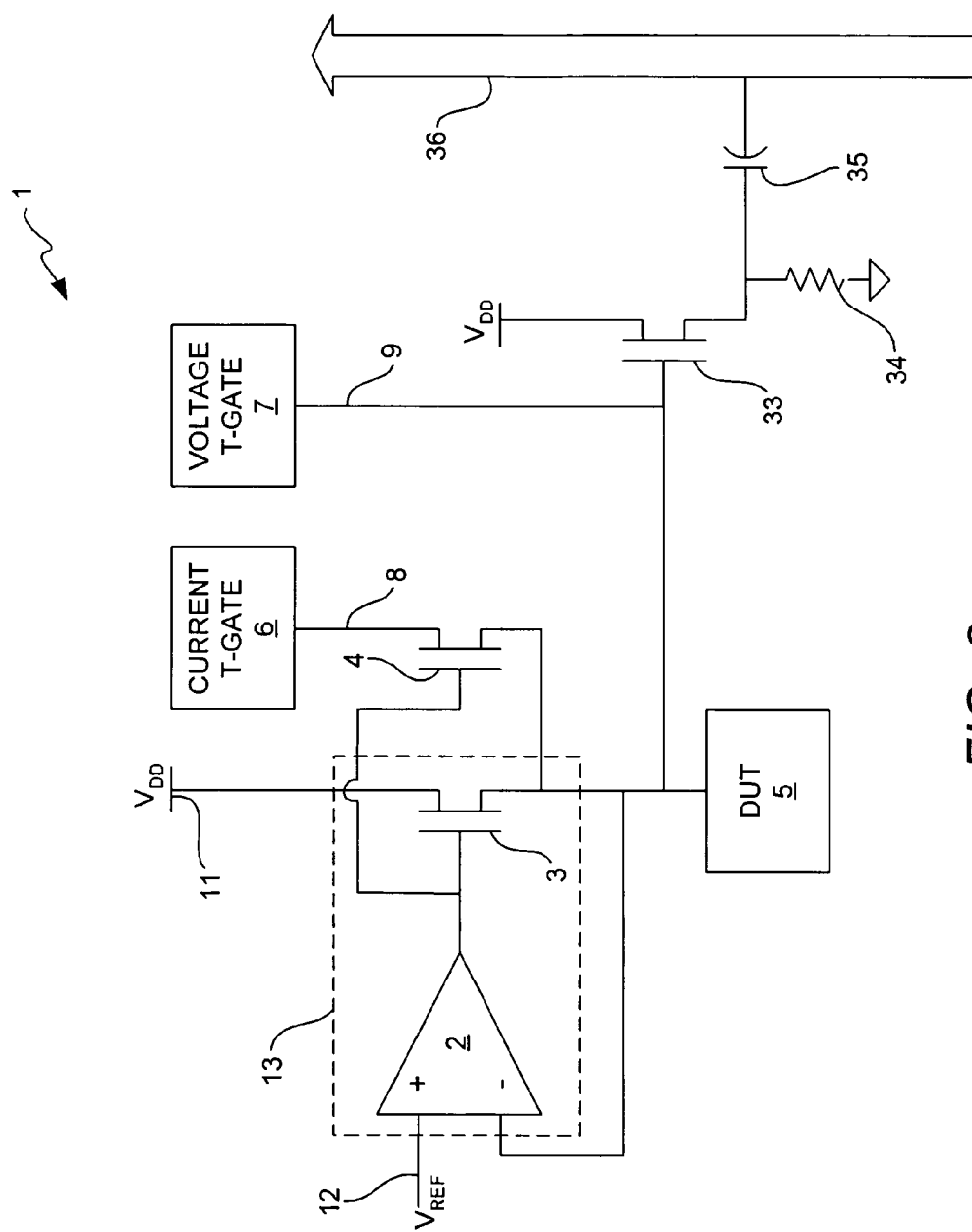
FIG. 3 illustrates a schematic diagram of an individual tester in accordance with an exemplary embodiment of the invention that includes circuitry that provides an indication as to whether a DUT needs to be checked for breakdown, wearout or failure.

FIG. 3 illustrates a schematic diagram of an individual tester of the invention that is identical to the tester shown in FIG. 1, but includes additional circuitry represented by components 33-36 for providing an indication as to whether the DUT 5 has experienced breakdown, failure or wearout. Rather than simply polling the T-gates 6 and 7 in the manner described above with reference to FIGS. 1 and 2 to measure current and voltage of the DUT 5, a capacitor 35 passes any transients that are produced by a change in the condition of the DUT 5 to a bus 36. As long as the DUT 5 remains in its steady state, the capacitor 35 is in its DC state and operates as an open circuit. When the current or voltage of the DUT change, the change produces a transient, which is passed by the capacitor 35 to the bus 36. When the capacitor 35 passes this transient to the bus 36, the bus 36 is modulated. A device (not shown) can be used to monitor the bus 36 and to detect a modulation in the bus 36. Thus, when the bus is modulated, this serves as a flag that indicates that the T-gates need to be polled to determine whether the associated DUTs have experienced breakdown, failure or wearout. This obviates the need to poll the T-gates at times other than when modulation of the bus 36 has been detected. The NMOS transistor 33 and the resistor 34 provide isolation from one tester to another so that a failure in a DUT of one tester will not result in a failure being detected in a DUT of another tester. A suitable value for the resistor 34 may be, for example, one kilo ohm (kΩ) and a suitable value for the capacitor 35 may be, for example, one pico farad (pf).

Figure 4:
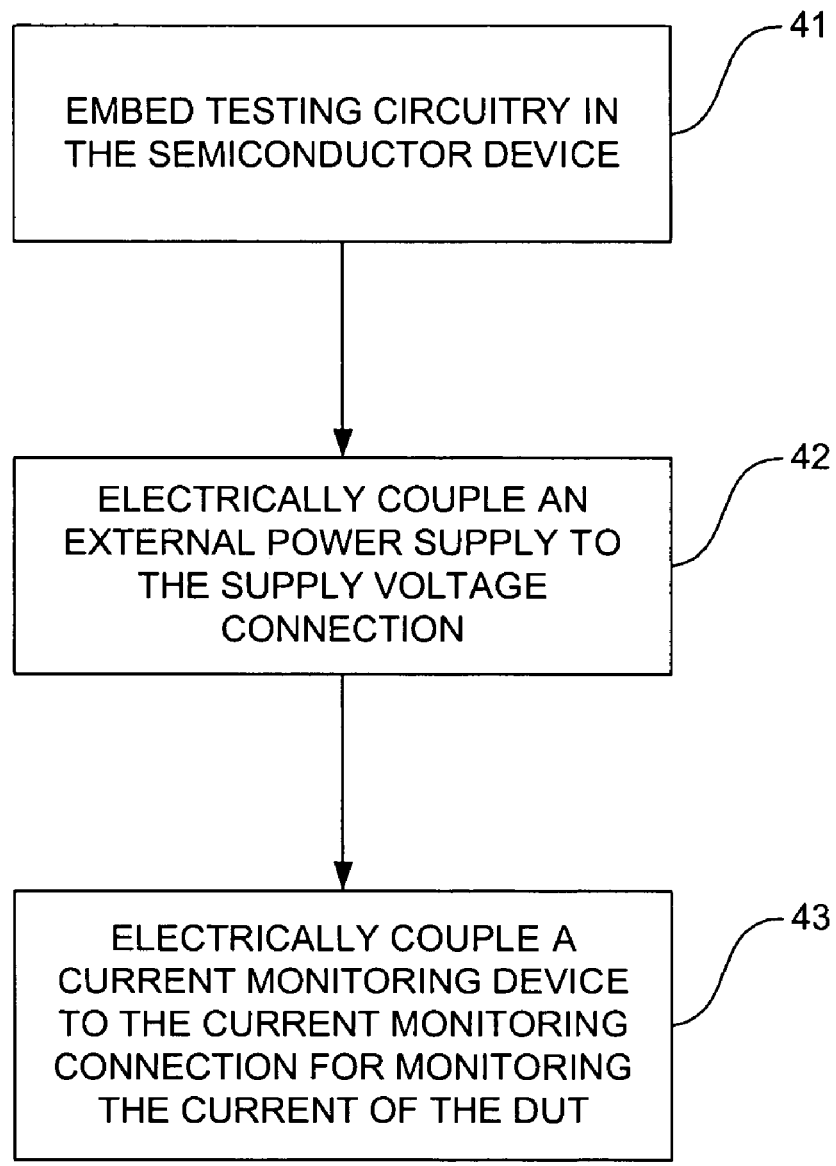
FIG. 4 illustrates a flowchart that represents the method of the invention in accordance with an exemplary embodiment.

FIG. 4 illustrates a flow chart that represents the method of the invention in accordance with an exemplary embodiment. During fabrication, the testing circuitry is embedded in the semiconductor device (e.g., a wafer or an IC package), as indicated by block 41. At the very least, the testing circuitry will comprise a single tester having a single DUT for testing a single location in the semiconductor device for breakdown. Typically, the testing circuitry embedded in the IC will include a plurality (e.g., hundreds or thousands) of testers. Each tester preferably includes at least a DUT, a voltage supply connection for connecting an external power supply to the voltage supply connection, and a current monitoring connection (e.g., current T-gate 6) for enabling a current monitoring device (e.g., an amp meter) to be electrically coupled (e.g., via bus 25 and T-gate 6 to the DUT 5). During testing, the external power supply is electrically coupled to the supply voltage connection 11, as indicated by block 42. A current monitoring device is electrically coupled to a current monitoring connection of the tester for measuring the current of the DUT, as indicated by block 43.

Figure 5:
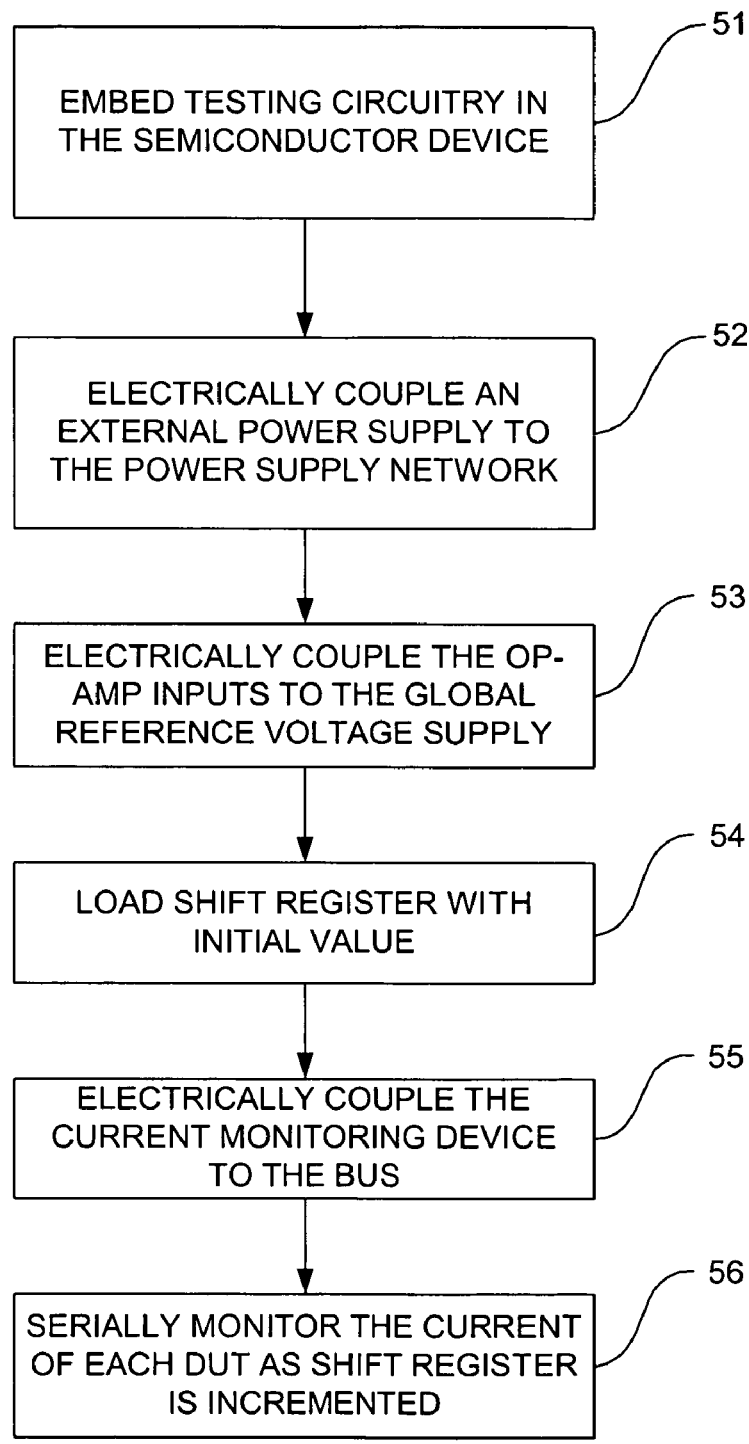
FIG. 5 illustrates a flowchart that represents the method of the invention in accordance with another exemplary embodiment.

FIG. 5 illustrates a flow chart of the method of the invention in accordance with another exemplary embodiment, in which the test circuitry comprises a plurality of the testers shown in FIG. 1. Block 51 in FIG. 5 is identical to block 41 in FIG. 4, which is directed to embedding the test circuitry in the wafer or IC. Typically, the test circuitry will contain hundreds or thousands of the testers, a power supply network to which each of the supply voltage connections of each of the testers is connected. Block 52 corresponds to electrically coupling the external power supply to the power supply network. As stated above, the supply voltage connections of all of the testers are electrically coupled to the power supply network such that the supply voltage is provided simultaneously to all of the testers. Block 53 corresponds to electrically coupling each of the op-amp inputs to the global reference voltage. This step is optional because the voltage regulator is optional, but preferred. Block 54 corresponds to loading the shift register with the initial value. Block 55 corresponds to electrically connecting the current monitoring device to the bus. Block 56 corresponds to serially measuring the current of each DUT as the shift register increments to the address associated with the T-gate of corresponding tester.

It should be noted that the invention has been described with reference to an exemplary embodiment, and that the invention is not limited to the embodiment described herein. As will be understood by those skilled in the art in view of the description provided herein, a variety of test circuit configurations can be built into the wafer to enable the reliability tests of the invention to be performed. The configurations shown in FIGS. 1 and 3 are examples of suitable circuits for enabling simultaneous measurement of current and voltage values of multiple DUTs. Those skilled in the art will understand that modifications may be made to the circuitry shown in FIGS. 1-3, and that all such modifications are within the scope of the invention. Also, although the invention has been described with reference to incorporating the test circuitry into a wafer, it could instead be incorporated in an IC package.

What is claimed is:

1. An apparatus for testing a semiconductor device for breakdown, wearout or failure, the test circuitry being embedded in the semiconductor device, the test circuitry comprising:
   at least two testers, each tester comprising:
      a device under test (DUT) embedded in the semiconductor device;
      a supply voltage connection for enabling a power supply that is external to the semiconductor device to be connected to the tester for supplying voltage to the DUT;
      a current monitoring connection for enabling a current monitoring device to be electrically coupled to the current monitoring connection for monitoring a current passing through the DUT; and
      a voltage regulator circuit comprising an operational amplifier (op-amp) having a non-inverting input that receives a reference voltage, the reference voltage being supplied to the op-amp from a global reference voltage supply that simultaneously supplies a reference voltage to all of the op-amps of all of the testers,
      each op-amp of each tester having an output that is electrically coupled to the DUT of the corresponding tester;
   and wherein the supply voltage connections of the testers are electrically coupled such that the supply voltages are simultaneously supplied to the supply voltage connections of the testers.

2. The test circuitry of claim 1, further comprising:
   a plurality of testers for testing a plurality of locations in the semiconductor device for breakdown, wearout or failure, each of said plurality of testers being at least substantially identical to said two testers, and wherein the power supply is a global power supply that supplies a supply voltage to all of the supply voltage connections of all of the testers.

3. The test circuitry of claim 2, further comprising:
   a power supply network, and wherein the supply voltage connections of all of the testers are electrically coupled to the power supply network to enable the global power supply to simultaneously provide a supply voltage to all of the testers.

4. The test circuitry of claim 2, wherein each of the DUTs of each of the testers is a transistor.

5. The test circuitry of claim 2, wherein each of the DUTs of each of the testers is a capacitor.

6. The test circuitry of claim 1, wherein the current monitoring connection of each of the testers comprises:
   a current transmission gate (T-gate) electrically coupled to the DUT, the current T-gate transmitting the current of the DUT to a bus when the current T-gate is activated.

7. The test circuitry of claim 6, wherein the current T-gates of the testers are activated serially such that no two current T-gates are transmitting simultaneously.

8. The test circuitry of claim 7, wherein the current T-gates are activated by contents of a shift register.

9. The test circuitry of claim 1, wherein each tester further comprises:
   a voltage monitoring connection for enabling a voltage monitoring device to be electrically coupled to the voltage monitoring connection for monitoring a voltage of the DUT.

10. The test circuitry of claim 9, further comprising:
   a plurality of testers for testing a plurality of locations in the semiconductor device for breakdown, wearout or failure, each of said plurality of testers being at least substantially identical to said at least two testers, and wherein the power supply is a global power supply that supplies a supply voltage to all of the supply voltage connections of all of the testers.

11. The test circuitry of claim 10, further comprising:
   a power supply network, and wherein the supply voltage connections of all of the testers are electrically coupled to the power supply network to enable the global power supply to simultaneously provide a supply voltage to all of the testers.

12. The test circuitry of claim 9, wherein each of the DUTs of each of the testers is a transistor.

13. The test circuitry of claim 1, wherein the voltage measurement connection of each of the testers comprises:
   a voltage transmission gate (T-gate) electrically coupled to the DUT, the voltage T-gate transmitting the voltage of the DUT to a bus when the voltage T-gate is activated.

14. The test circuitry of claim 13, wherein the voltage T-gates are activated serially such that no two voltage T-gates are transmitting simultaneously.

15. The test circuitry of claim 14, wherein the voltage T-gates are activated by contents of a shift register.

16. A method for testing a semiconductor device for breakdown, wearout or failure, comprising:

embedding testing circuitry in the semiconductor device, the test circuitry comprising at least two testers, each of the testers comprising:
- a device under test (DUT) embedded in the semiconductor device;
- a voltage supply connection for enabling a power supply that is external to the semiconductor device to be connected to the tester for supplying a supply voltage to the DUT;
- a current monitoring connection for enabling a current monitoring device to be electrically coupled to the current monitoring connection for measuring a current passing through the DUT; and
- a voltage regulator circuit comprising an operational amplifier (op-amp) having a non-inverting input that receives a reference voltage, the reference voltage being supplied to the op-amp from a global reference voltage supply that simultaneously supplies a reference voltage to all of the op-amps of all of the testers, each op-amp of each tester having an output that is electrically coupled to the DUT of the corresponding tester;

electrically coupling the external power supply to the voltage supply connection for supplying a supply voltage to the DUTs of the testers, and wherein the supply voltage connections of the testers are electrically coupled such that the supply voltages are simultaneously supplied to the supply voltage connections of the testers; and electrically coupling a current monitoring device to the current monitoring connection for monitoring a current of the DUT.

17. The method of claim 16, wherein the test circuitry embedded in the semiconductor device comprises a plurality of testers for testing a plurality of locations in the semiconductor device for breakdown, each of said plurality of testers being at least substantially identical to said two testers, and wherein the power supply is a global power supply that supplies a supply voltage to all of the supply voltage connections of all of the testers.

* * * * *